United States Patent
Huang et al.

(10) Patent No.: US 6,927,123 B2
(45) Date of Patent: Aug. 9, 2005

(54) METHOD FOR FORMING A SELF-ALIGNED BURIED STRAP IN A VERTICAL MEMORY CELL

(75) Inventors: Cheng-Chih Huang, Taipei (TW);
Sheng-Wei Yang, Taipei (TW);
Neng-Tai Shih, Taipei (TW);
Chen-Chou Huang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 2 days.

(21) Appl. No.: 10/846,272

(22) Filed: May 14, 2004

(65) Prior Publication Data

US 2005/0124110 A1 Jun. 9, 2005

(30) Foreign Application Priority Data

Dec. 5, 2003 (TW) ................ 92134313 A

(51) Int. Cl.[7] .............. H01L 21/8242; H01L 21/20
(52) U.S. Cl. .............. 438/249; 438/246; 438/247; 438/244; 438/392; 438/390; 438/389; 438/387
(58) Field of Search ................ 438/241–249, 438/386–392; 257/301–305

(56) References Cited

U.S. PATENT DOCUMENTS

| | | | |
|---|---|---|---|
| 6,066,527 A * | 5/2000 | Kudelka et al. | 438/243 |
| 6,281,539 B1 * | 8/2001 | Mandelman et al. | 257/302 |
| 6,288,422 B1 * | 9/2001 | Mandelman et al. | 257/301 |
| 6,320,215 B1 * | 11/2001 | Bronner et al. | 257/301 |
| 6,406,970 B1 * | 6/2002 | Kudelka et al. | 438/386 |
| 6,426,526 B1 * | 7/2002 | Divakaruni et al. | 257/302 |
| 6,437,381 B1 * | 8/2002 | Gruening et al. | 257/296 |
| 6,501,117 B1 * | 12/2002 | Radens et al. | 257/301 |
| 6,605,504 B1 * | 8/2003 | JaiPrakash et al. | 438/243 |
| 6,638,815 B1 * | 10/2003 | Bronner et al. | 438/246 |
| 6,703,274 B1 * | 3/2004 | Chidambarrao et al. | 438/243 |
| 6,759,702 B2 * | 7/2004 | Radens et al. | 257/302 |
| 2001/0038113 A1 * | 11/2001 | Bronner et al. | 257/301 |
| 2002/0090780 A1 * | 7/2002 | Divakaruni et al. | 438/246 |
| 2002/0149047 A1 * | 10/2002 | Divakaruni et al. | 257/302 |
| 2004/0029346 A1 * | 2/2004 | Jaiprakash et al. | 438/268 |

* cited by examiner

Primary Examiner—Jennifer M. Kennedy
(74) Attorney, Agent, or Firm—Quintero Law Office

(57) ABSTRACT

A method for forming a self-aligned buried strap in a vertical memory cell. A semiconductor substrate with a trench is provided, a capacitor wire is formed on the bottom portion of the trench, and a collar dielectric layer is formed between the capacitor wire and the semiconductor substrate to act as an isolation. The capacitor wire and the collar dielectric layer are etched to a predetermined depth, such that a gap is formed between the spacer and the capacitor wire and the collar dielectric layer. Ions are doped into the exposed semiconductor substrate to form an ion doped area acting as a buried strap. The spacer is removed, and an exposed collar dielectric layer is etched below the level of the surface of the capacitor wire, and a groove is formed between the capacitor wire and the trench sidewall to fill with a conducting layer.

26 Claims, 5 Drawing Sheets

METHOD FOR FORMING A SELF-ALIGNED BURIED STRAP IN A VERTICAL MEMORY CELL

BACKGROUND OF THE INVENTION

1. Field of the Invention

The invention relates to a memory cell, and more particularly to a method for forming a vertical memory cell with a buried strap aligned with a trench top oxide layer.

2. Description of the Related Art

Memory devices, such as dynamic random access memory (DRAM), for non-volatile storage of information, are currently in widespread use, in a myriad of applications.

A conventional DRAM consists of a transistor and a capacitor, with electrical charges moving in or out of the capacitor during reading or writing. Typically deep trench capacitor is used to reduce the size of the memory device. The capacitor is disposed in the deep trench bottom, the transistor is disposed at the deep trench top, and a thin dielectric layer, such as trench top oxide (TTO) layer, acting as an electrical insulating layer is disposed between the capacitor and the transistor.

FIG. 1 is a cross-section of a conventional vertical DRAM. The vertical DRAM comprises a semiconductor 100 with a deep trench, in which the deep trench is defined by a mask layer consisting of a pad oxide layer 102 and a nitride layer 103. A capacitor 105 is disposed in the deep trench bottom 105, an oxide layer 104 is formed between the capacitor 105 and the substrate, a doped poly layer 107 is formed on the oxide layer 104, and a thin nitride layer 106 is formed between the doped poly layer 107 and the oxide layer 104. A trench top oxide (TTO) layer 108 is formed on the elements to insulate the capacitor 105 and a vertical transistor formed thereon. The doped poly layer 107 is annealed to form an ion diffusion area 109 acting as a buried strap and a drain, and disposed in the semiconductor substrate 100 beside the TTO layer 108. After a gate oxide layer 110 and a doped poly layer 112 acting as a gate are formed, the DRAM with a vertical channel is complete.

As the ion diffused area 109 covers the semiconductor substrate 100 outside the TTO layer 108 and the doped poly layer 112, when the ion diffused area is increased, ion concentration is lowered, thereby increasing the resistance. As a result, writing and reading currents of the capacitor 105 are affected.

SUMMARY OF THE INVENTION

The present invention is directed to a method for forming a self-aligned buried strap and a vertical memory cell with a self-aligned buried strap.

Accordingly, the present invention provides a method for forming a self-aligned buried strap. A semiconductor substrate with a trench is provided, a capacitor wire is formed in the bottom of the trench, and a collar dielectric layer is formed between the capacitor wire and the semiconductor substrate to act as an isolation. A spacer is formed on a sidewall of the upper portion of the trench. The capacitor wire and the collar dielectric layer are etched to a predetermined depth using the spacer acting as an etching mask, such that a gap is formed between the spacer and the capacitor wire and the collar dielectric layer to expose a portion of the semiconductor substrate. Ions are doped into the exposed semiconductor substrate to form an ion doped area acting as a buried strap. The spacer is removed to expose a portion of the collar dielectric layer. The exposed collar dielectric layer is etched below the level of the surface of the capacitor wire, and a groove is formed between the capacitor wire and the trench sidewall. The groove is filled with a conductive layer. A trench top insulating layer is formed over the trench bottom, and which is lower than the top surface of the ion doped area.

Accordingly, the present invention provides a method for forming a vertical memory cell with a self-aligned buried strap. A semiconductor substrate with a trench is provided, a capacitor wire is formed on the bottom portion of the trench, and a collar dielectric layer is formed between the capacitor wire and the semiconductor substrate to act as an isolation. A spacer is formed on a sidewall of the upper portion of the trench. The capacitor wire and the collar dielectric layer are etched to a predetermined depth using the spacer acting as an etching mask, such that a portion of the semiconductor substrate is exposed. Ions are doped into the exposed semiconductor substrate to form an ion doped area acting as a buried strap. The spacer is removed. The exposed collar dielectric layer is etched below the level of the surface of the capacitor wire, thereby a gap is formed between the spacer and the capacitor wire and the sidewall of the trench. An insulating layer is conformably formed on the surface of the trench, and the trench is filled with a first conducting layer. A trench top insulating layer is formed, and the trench top insulating layer is lower than the top of the ion doped area. A gate dielectric layer is conformably formed on the sidewall of the trench. A second conducting layer is formed in the trench.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 2a to 2h illustrate a method for forming a vertical DRAM with a self-aligned buried strap of the present invention.

Figure 1:
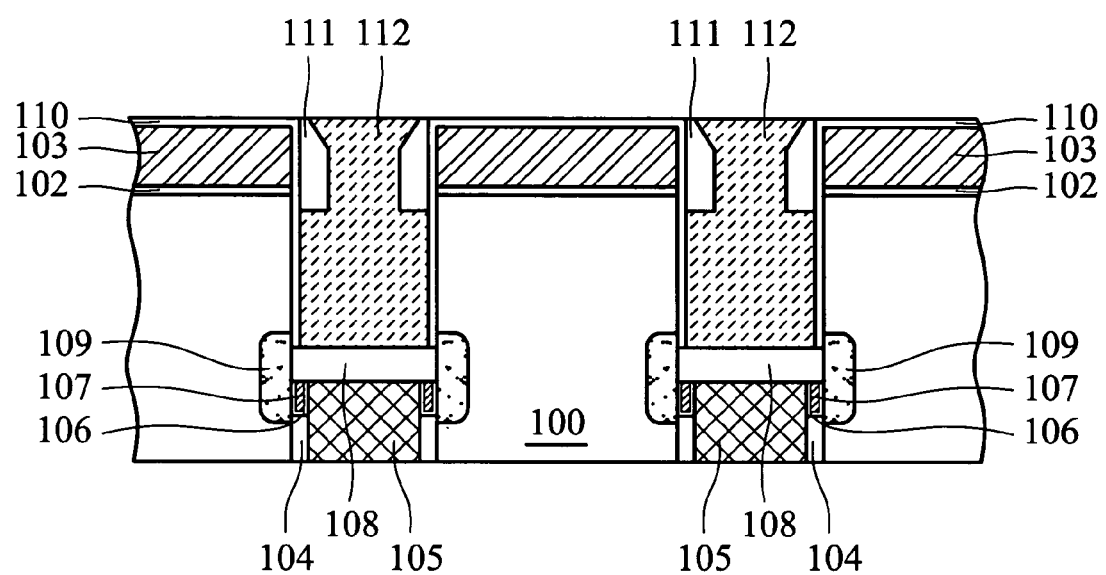
FIG. 1 is a cross-section of a conventional vertical DRAM.
Figure 2A:
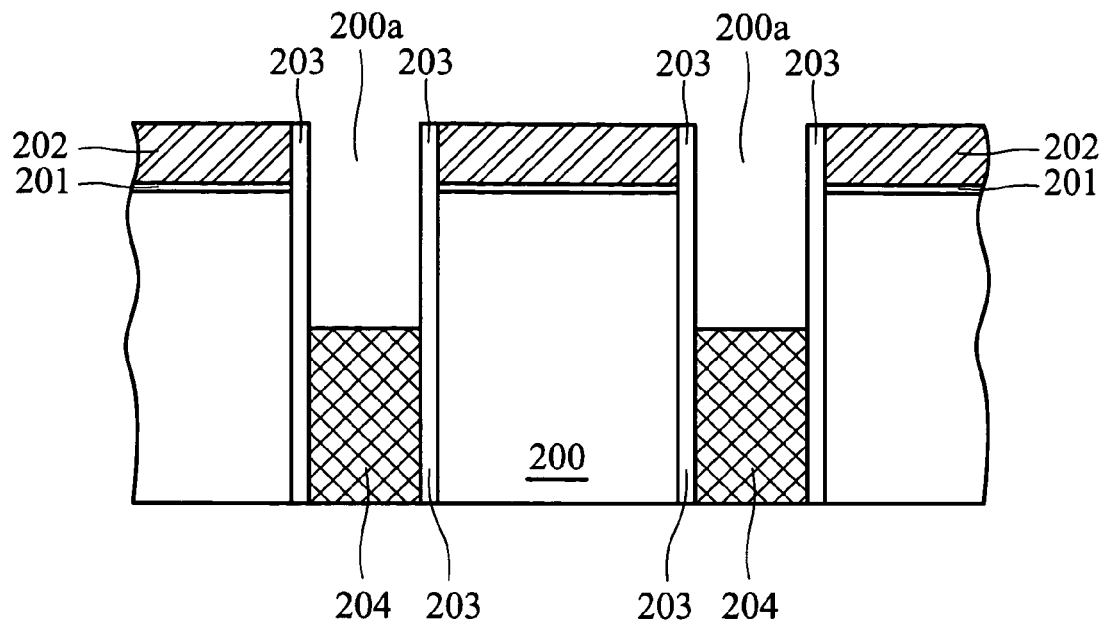
FIGS. 2a to 2h are cross-sections of the method for forming a vertical DRAM with a self-aligned buried strap of the present invention.

In FIG. 2a, a semiconductor substrate 200 is provided, and a pad oxide layer 201 and a pad nitride layer 202 are sequentially formed thereon.

The semiconductor substrate 200 is anisotropically etched using a patterned resist layer acting as an etching mask to form a trench 200a going deep into the semiconductor substrate 200. The trench 200a acting as a buried dynamic random access memory (DRAM) described in the following.

A trench capacitor is formed in the bottom portion of the trench 200a, and comprises a buried strap (BP), a conformable capacitor dielectric layer 203, such as an oxide layer, and a plate. A dielectric layer 203 is conformably formed on the surface of the pad nitride layer 202 and the trench 200a above the trench capacitor by chemical vapor deposition (CVD). A conducting layer is formed on the semiconductor substrate 200, the trench 200a is filled with the conducting layer, and the conducting layer is recessed to form a conducting layer 204 at a predetermined depth in the trench 200a. The conducting layer 204 such as a poly layer or epi-silicon layer acts as a capacitor wire.

Hereinafter, the process of forming the vertical transistor is described.

Figure 2B:
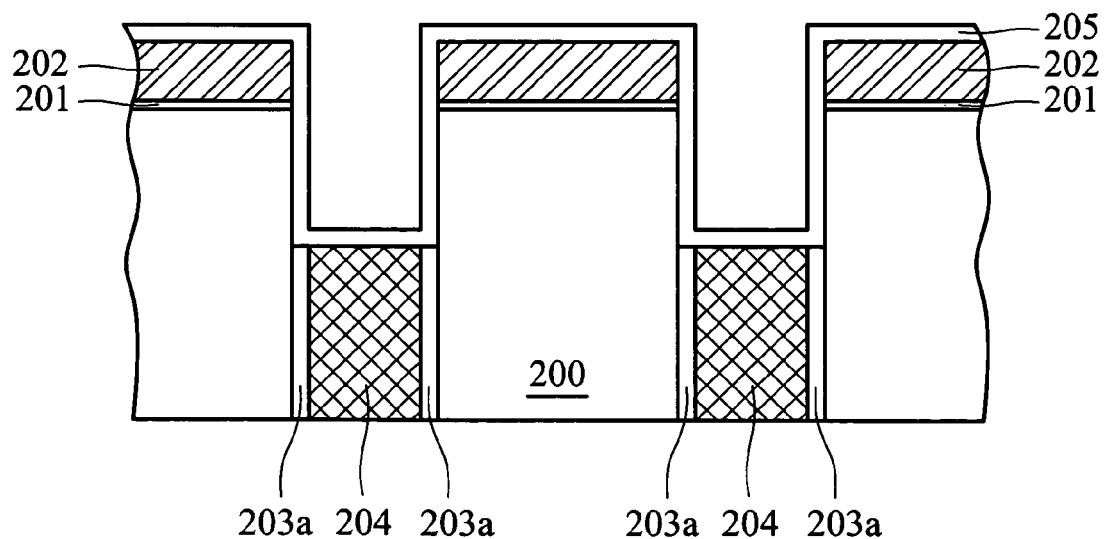

In FIG. 2b, the exposed dielectric layer 203 is partially removed to form a collar dielectric layer 203a. An insulating layer 205, such as a nitride layer, of about 200 to 600 Å is conformally formed on the surface of the pad nitride layer 202, the trench 200a, the conducting layer 204a, and the collar dielectric layer 203a. The collar dielectric layer 203a insulates the conducting layer 204a and the semiconductor substrate 200.

Figure 2C:
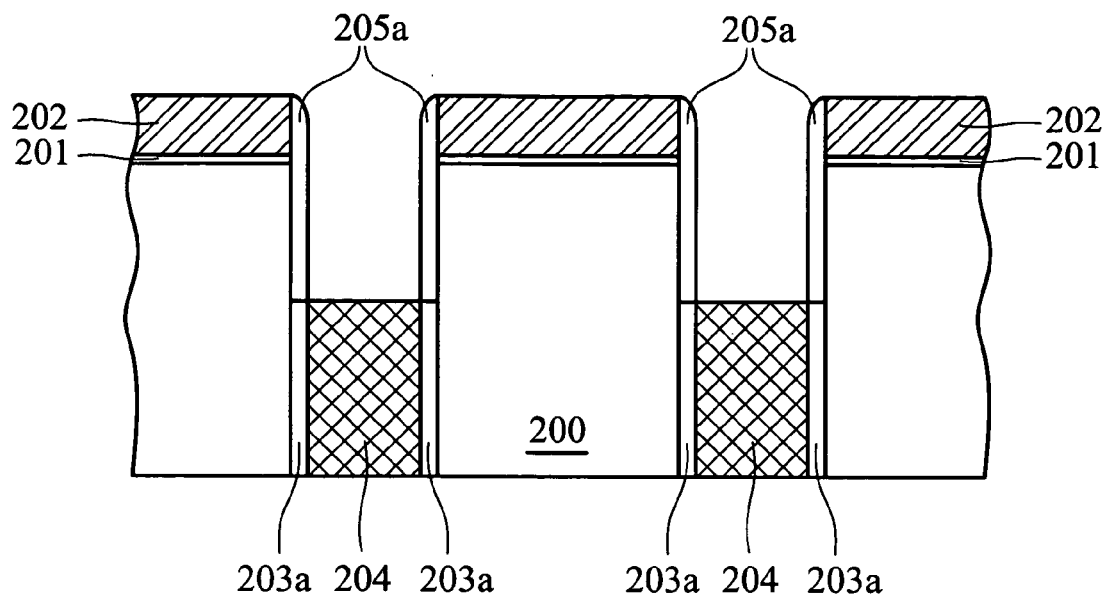

In FIG. 2c, the insulating layer 205 is anisotropically etched by plasma etching or reactive ion etching until the insulating layer 205 above the conducting layer 204 is removed, thereby a spacer 205a is formed on the sidewall of the trench 200a.

Hereinafter, a characteristic process of the present invention is described.

Figure 2D:
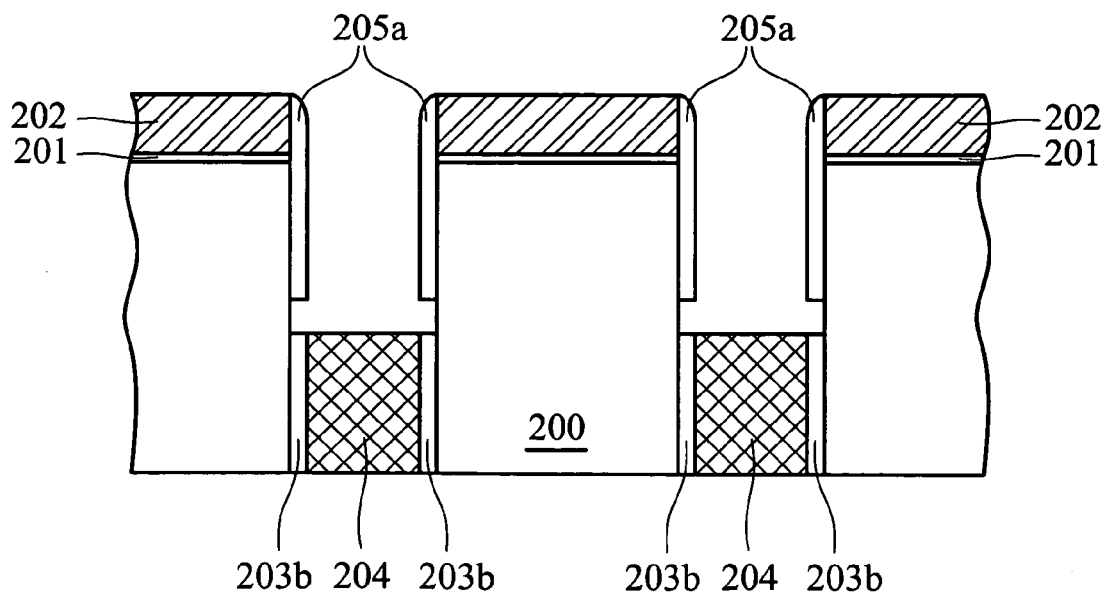

In FIG. 2d, the exposed conducting layer 204a is wet etched by $NH_4OH$ solution to remove the conducting layer 204a about 200 to 400 Å, and the collar dielectric layer 203a is wet etched by diluted HF (DHF) or buffer oxide etcher (BOE) to form a collar dielectric layer 203b, such that the semiconductor substrate 200 on the partial sidewall of the trench 200a is exposed.

Figure 2E:
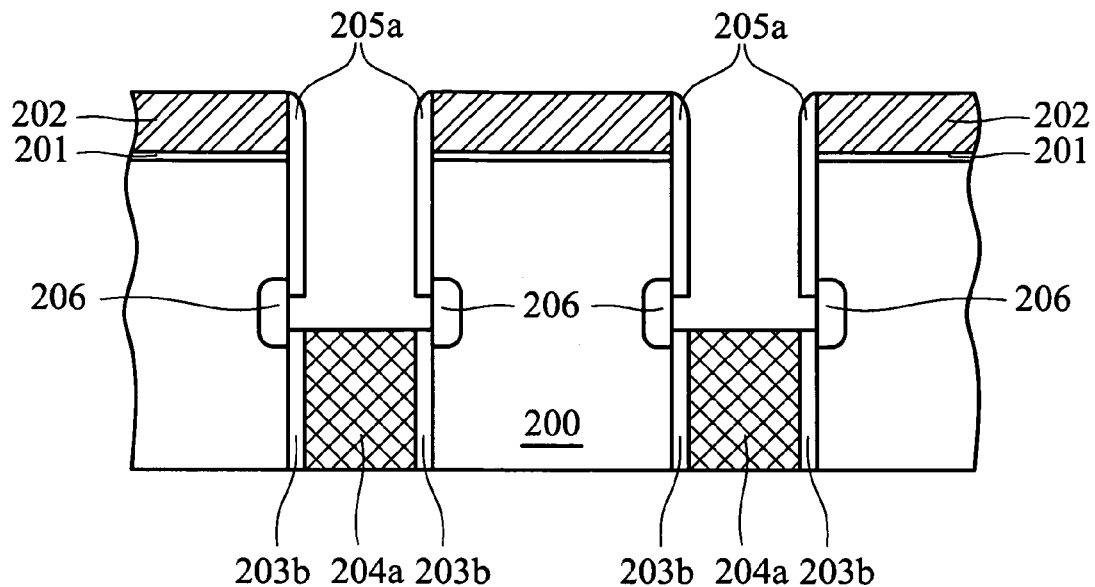

In FIG. 2e, the exposed semiconductor substrate 200 is ion doped by gas phase doping (GPD) to form an ion doped area 206. The ion doped area 206 acts as a buried strap to electric the conducting layer 204a and a gate of a transistor subsequently formed. The ion doped area 206 also acts as a drain of the transistor.

Hereinafter, a conventional thermal anneal process for forming the ion doped area 206 is described.

An n+ type ion doped insulating layer, such as an arsenic silicate glass (ASG) layer, is conformably formed on the surface of the exposed semiconductor substrate 200 in the trench 200a. The semiconductor substrate 200 is heated to diffuse the dopant from the doped insulating layer to the semiconductor substrate 200, thereby the ion doped area 206 is formed, and the doped insulating layer is then removed.

The length of the annealing process time for GPD is less than the conventional anneal, further, the anneal process may be omitted to reduce the thermal budget.

Figure 2F:
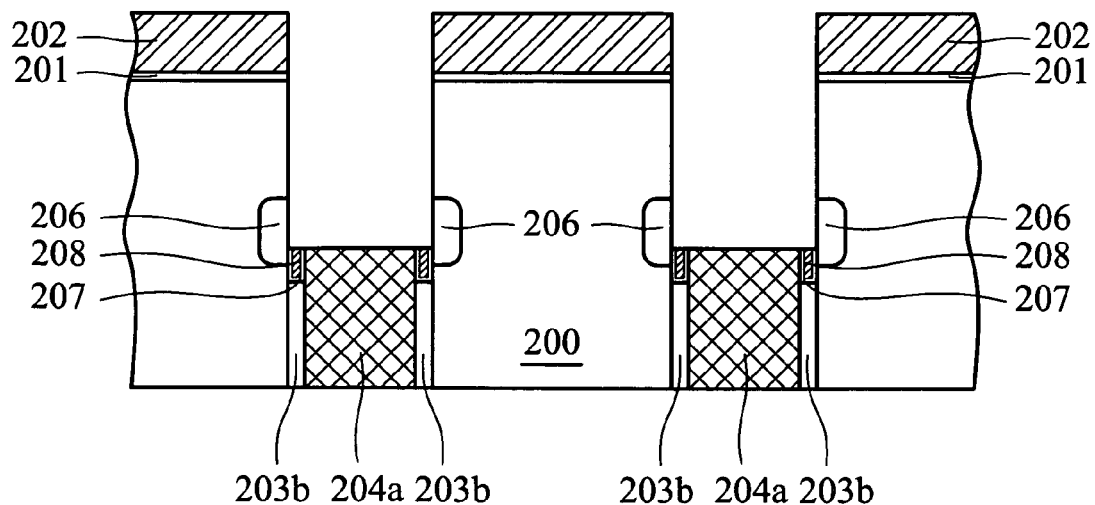

In FIG. 2f, after the spacer 205a is removed, the collar 203b is etched to lower the level of the surface of the conducting layer 204a, such that a groove is formed between the conducting layer 204a and the sidewall of the trench 200a. A thin insulating layer is conformably formed on the surface of the trench 200a and the groove by chemical vapor deposition (CVD), and subsequently the trench 200a and the groove are filled with a conducting layer.

The conducting layer and the thin insulating layer are recessed until the insulating layer 207 and the conducting layer 208 are formed in the groove, respectively. The conducting layer 208, such as a doped or undoped poly layer or epi-silicon layer, may be used to electrically connect the ion doped area 206 and the conducting layer 204a acting as the capacitor wire. The insulating layer 207, such as a thin nitride layer, may be used to isolate the conducting layer 208 and the semiconductor substrate 200. The thickness of the thin nitride layer is thinner than 10 Å, preferably, the thickness is 6 Å.

Figure 2G:
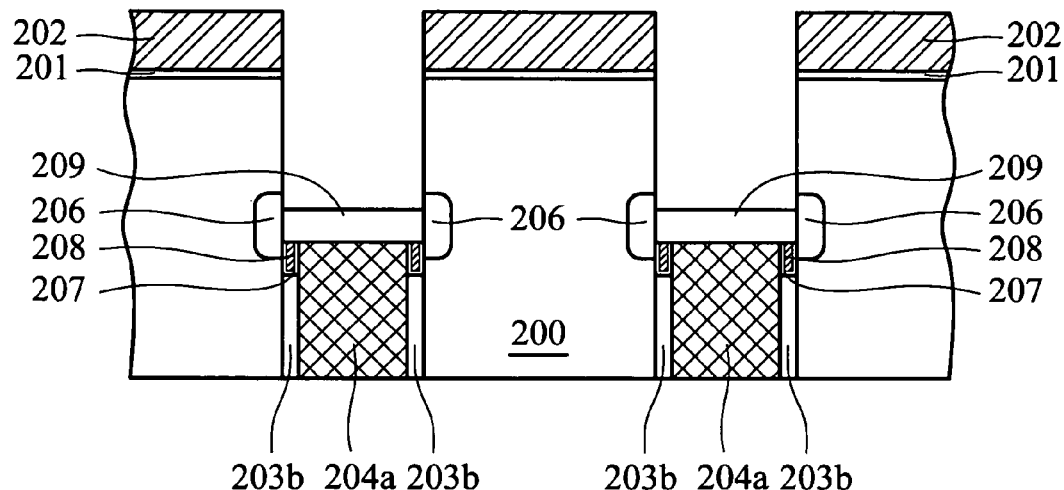

In FIG. 2g, an insulating layer is conformably formed on the surface of the semiconductor substrate 200 and the elements formed thereon. The insulating layer is anisotropically etched to remove the insulating layer on the sidewall of the trench 200a, such that a trench top insulating layer 209 is formed to cover the conducting layer 204a, the insulating layer 207, and the conducting layer 208 in the bottom portion of the trench 200a. The trench top insulating layer 209, such as a trench top oxide (TTO) layer, is lower than the surface of the ion doped area 206 to expose a part of the ion doped area 206, and isolates the conducting layer 204a and the gate of the subsequently transistor formed.

Figure 2H:
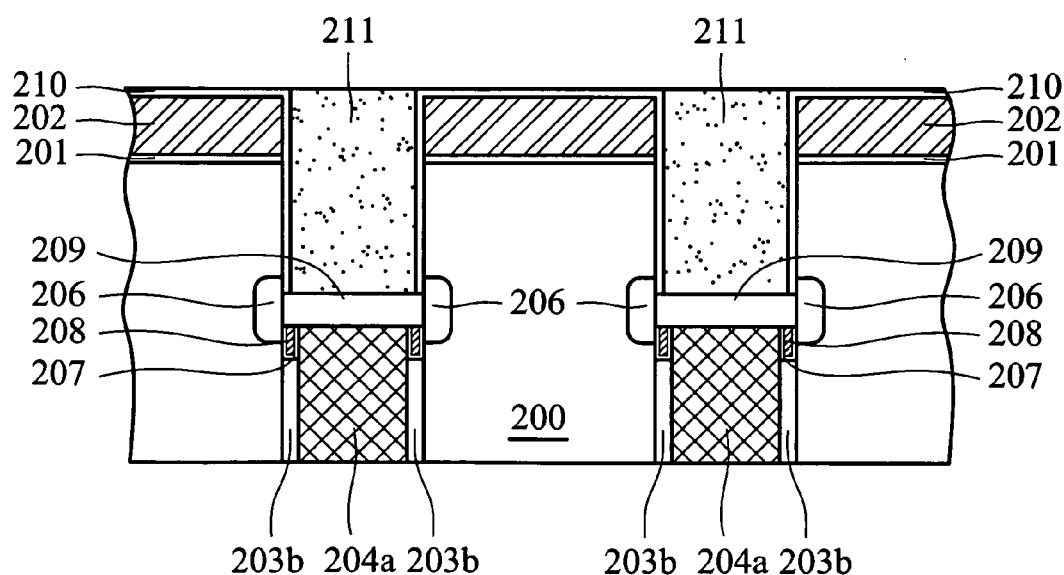

In FIG. 2h, a gate dielectric layer 210 is conformably formed on the surface of the pad nitride layer 202 and the sidewall of the trench 200a, thereafter a conducting layer is formed on the semiconductor substrate 200, and the trench 200a is filled with the conducting layer. The conducting layer is planarized to leave the conducting layer 211 in the trench 200a. The conducting layer 211, such as a poly layer or epi-silicon layer, acts as a gate. The DRAM with vertical channel of the present invention is thereby accomplished.

The gate dielectric layer 210, such as a gate oxide layer, may be formed by thermal oxidation, and thickness is thereof 40 to 80 Å. As the trench top insulating layer 209 is an oxide layer, the gate oxide layer is not formed thereon.

In order to form a high quality gate oxide layer acting as the gate dielectric layer 210, an oxide layer of about 60 to 100 Å may be formed on the sidewall of the trench 200a prior to forming the trench top insulating layer 209. The oxide layer is removed at the step in which the insulating layer on the sidewall of the trench is removed to form the trench top insulating layer 209. Thus, the semiconductor substrate 200 on the sidewall of the trench 200a is completely cleaned prior to forming the gate dielectric layer 210.

According to the method for forming the DRAM with vertical channel of the present invention, the ion doped area acting as the buried strap is formed before the trench top oxide layer. The buried strap is electrically connected to the transistor and the capacitor wire, while the resistance is not large enough to affect the write/read speed of the electrons of the capacitor due to precise control of size and the concentration of the diffused region. Therefore, the efficiency of the DRAM is improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a self-aligned buried strap, comprising:

providing a semiconductor substrate with a trench, wherein a capacitor wire is formed on the bottom portion of the trench, and a collar dielectric layer is formed between the capacitor wire and the semiconductor substrate to act as an isolation;

forming a spacer on a sidewall of the upper portion of the trench;

etching the capacitor wire and the collar dielectric layer to a predetermined depth on the same level using the spacer as an etching mask, thereby forming a gap between the spacer and the capacitor wire and the collar dielectric layer to expose a portion of the semiconductor substrate and a portion of the collar dielectric layer;

doping ions into the exposed semiconductor substrate to form an ion doped area acting as a buried strap;

removing the spacer;

after doping ions etching the exposed collar dielectric layer below the level of the surface of the capacitor wire, thereby forming a groove between the capacitor wire and the trench sidewall;

filling a conducting layer in the groove; and forming a trench top insulating layer over the trench bottom, wherein the trench top insulating layer is lower than the top surface of the ion doped area.

2. The method for forming a self-aligned buried strap of claim 1, wherein the collar dielectric layer is an oxide layer.

3. The method for forming a self-aligned buried strap of claim 1, wherein the capacitor wire is a poly layer.

4. The method for forming a self-aligned buried strap of claim 1, wherein the spacer is a nitride layer.

5. The method for forming a self-aligned buried strap of claim 1, wherein a method for ion doping is gas phase doping or thermal oxidation.

6. The method for forming a self-aligned buried strap of claim 1, wherein the ion doped area is an n+ type ion doped area.

7. The method for forming a self-aligned buried strap of claim 6, wherein the n+ type ion doped area is an As ion doping area.

8. The method for forming a self-aligned buried strap of claim 1, wherein the conducting layer is a poly layer or an epi-silicon layer.

9. The method for forming a self-aligned buried strap of claim 1, further comprising a thin nitride layer between the conducting layer and the groove.

10. The method for forming a self-aligned buried strap of claim 9, wherein thickness of the thin nitride layer is less than 10 Å.

11. The method for forming a self-aligned buried strap of claim 10, wherein thickness of the thin nitride layer is 6 Å.

12. The method for forming a self-aligned buried strap of claim 1, wherein the trench top insulating layer is a trench top oxide layer.

13. A method for forming a vertical memory cell with a self-aligned buried strap, comprising:

providing a semiconductor substrate with a trench, wherein a capacitor wire is formed on the bottom portion of the trench, and a collar dielectric layer is formed between the capacitor wire and the semiconductor substrate to act as an isolation;

forming a spacer on a sidewall of the upper portion of the trench;

etching the capacitor wire and the collar dielectric layer to a predetermined depth on the same level using the spacer acting as an etching mask, thereby exposing a portion of the semiconductor substrate and a portion of the collar dielectric layer;

doping ions into the exposed semiconductor substrate to form an ion doped area acting as a buried strap;

removing the spacer;

after doping ions etching the exposed collar dielectric layer below the level of the surface of the capacitor wire, thereby forming a projection of the capacitor wire and exposing the sidewall of the trench;

conformably forming a insulating layer on the surface of the trench;

filling a first conducting layer in the trench;

forming a trench top insulating layer, wherein the trench top insulating layer is lower than the top of the ion doped area;

conformably forming a gate dielectric layer on the sidewall of the trench; and forming a second conducting layer in the trench.

14. The method for forming a vertical memory cell with a self-aligned buried strap of claim 13, wherein the collar dielectric layer is an oxide layer.

15. The method for forming a vertical memory cell with a self-aligned buried strap of claim 13, wherein the capacitor wire is a poly layer.

16. The method for forming a vertical memory cell with a self-aligned buried strap of claim 13, wherein the spacer is a nitride layer.

17. The method for forming a vertical memory cell with a self-aligned buried strap of claim 13, wherein a method for ion doping is gas phase doping or thermal oxidation.

18. The method for forming a vertical memory cell with a self-aligned buried strap of claim 13, wherein the ion doped area is an n+ type ion doped area.

19. The method for forming a vertical memory cell with a self-aligned buried strap of claim 18, wherein the n+ type ion doped area is an As ion doping area.

20. The method for forming a vertical memory cell with a self-aligned buried strap of claim 13, wherein the insulating layer is a nitride layer.

21. The method for forming a vertical memory cell with a self-aligned buried strap of claim 20, wherein the thickness of the thin nitride layer is less than 10 Å.

22. The method for forming a vertical memory cell with a self-aligned buried strap of claim 20, wherein the thickness of the thin nitride layer is 6 Å.

23. The method for forming a vertical memory cell with a self-aligned buried strap of claim 13, wherein the conducting layer is a poly layer or an epi-silicon layer.

24. The method for forming a vertical memory cell with a self-aligned buried strap of claim 13, wherein the trench top insulating layer is a trench top oxide layer.

25. The method for forming a vertical memory cell with a self-aligned buried strap of claim 13, wherein the gate dielectric layer is a gate oxide layer.

26. The method for forming a vertical memory cell with a self-aligned buried strap of claim 13, wherein the second conducting layer is a poly layer.

* * * * *